(12) United States Patent
Classen et al.

(10) Patent No.: US 8,928,099 B2
(45) Date of Patent: Jan. 6, 2015

(54) MICROMECHANICAL COMPONENT AND METHOD FOR THE MANUFACTURE OF SAME

(71) Applicants: Johannes Classen, Reutlingen (DE); Jochen Reinmuth, Reutlingen (DE); Andreas Scheurle, Leonberg (DE)

(72) Inventors: Johannes Classen, Reutlingen (DE); Jochen Reinmuth, Reutlingen (DE); Andreas Scheurle, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/757,261

(22) Filed: Feb. 1, 2013

(65) Prior Publication Data

US 2013/0200473 A1    Aug. 8, 2013

(30) Foreign Application Priority Data

Feb. 2, 2012   (DE) .......................... 10 2012 201 480

(51) Int. Cl.

| | |
|---|---|
| *H01L 29/84* | (2006.01) |
| *G01P 15/08* | (2006.01) |
| *B81B 3/00* | (2006.01) |
| *B81C 1/00* | (2006.01) |
| *G01P 15/125* | (2006.01) |

(52) U.S. Cl.
CPC ........... *B81B 3/0018* (2013.01); *B81C 1/00015* (2013.01); *B81C 1/0015* (2013.01); *G01P 15/0802* (2013.01); *G01P 15/125* (2013.01); *B81B 2201/025* (2013.01)
USPC .............. 257/415; 257/417; 257/418; 438/52

(58) Field of Classification Search
CPC ................ G01P 15/00; G01P 15/0802; B81B 2201/0228; B81B 2201/0242; B81B 2201/0235
USPC ............................... 257/415–420; 438/50, 53
See application file for complete search history.

(56) References Cited

U.S. PATENT DOCUMENTS

| | | | | |
|---|---|---|---|---|
| 5,576,250 | A | * | 11/1996 | Diem et al. ..................... 438/50 |
| 5,844,286 | A | * | 12/1998 | Hase .............................. 257/417 |
| 6,634,232 | B1 | * | 10/2003 | Rettig et al. ............... 73/514.15 |
| 7,878,061 | B2 | | 2/2011 | Classen et al. |

FOREIGN PATENT DOCUMENTS

DE   10 2007 060 878   6/2009

* cited by examiner

*Primary Examiner* — Cuong Q Nguyen
*Assistant Examiner* — Nishath Yasmeen
(74) *Attorney, Agent, or Firm* — Kenyon & Kenyon LLP

(57) ABSTRACT

A method for manufacturing a micromechanical component is described in which a trench etching process and a sacrificial layer etching process are carried out to form a mass situated movably on a substrate. The movable mass has electrically isolated and mechanically coupled subsections of a functional layer. A micromechanical component having a mass situated movably on a substrate is also described.

9 Claims, 15 Drawing Sheets

MICROMECHANICAL COMPONENT AND METHOD FOR THE MANUFACTURE OF SAME

CROSS-REFERENCE

The present application claims the benefit under 35 U.S.C. §119 of German Patent Application No. DE 102012201480.2 filed on Feb. 2, 2012, which is expressly incorporated herein by reference in its entirety.

FIELD

The present invention relates to a method for manufacturing a micromechanical component in which a trench etching process and a sacrificial layer etching process are carried out to form a mass situated movably on a substrate. The present invention furthermore relates to a micromechanical component which has a mass situated movably on a substrate.

BACKGROUND INFORMATION

Micromechanical components, such as acceleration or yaw-rate sensors used in the automotive industry, usually have a movable mass which is deflectably suspended on a substrate via spring structures. The movable mass is also referred to as a microstructure or MEMS (microelectromechanical system) structure.

In a conventional method for manufacturing a micromechanical component, a layer system is formed on a substrate which includes a relatively thin buried polysilicon layer, a sacrificial layer, and another relatively thick polysilicon layer above the buried polysilicon layer. The buried polysilicon layer is used as a printed conductor plane, and the other polysilicon layer is used as a functional layer. To expose the polysilicon functional layer and thus make available a movable mass, a trench etching process and a sacrificial layer etching process are carried out.

Another method for manufacturing a micromechanical component in which a layer system is formed on a substrate, which includes three polysilicon layers situated one on top of the other and sacrificial layers situated in-between, is described in German Patent Application No. DE 10 2007 060 878 A1. Here, it is provided to expose the upper polysilicon layer and the middle polysilicon layer, thus resulting in two functional layers being situated one on top of the other. The middle functional layer may also be used as a printed conductor plane or as an additional mechanically self-supporting or deflectable layer. It is possible to manufacture mechanically self-supporting elements from the individual functional layers or from any combination of the two functional layers.

The above-named manufacturing processes cannot be used to form micromechanical elements which are both electrically isolated from one another and mechanically coupled to one another. Such an electrically insulating coupling would, however, be advantageous for various micromechanical sensors. Alternative techniques for manufacturing self-supporting and mechanically coupled as well as electrically isolated structures are associated with relatively great expenditures.

Summary

An object of the present invention is to provide an improved approach for providing a micromechanical component having self-supporting and mechanically coupled as well as electrically isolated structures at the same time.

According to the present invention, an example method is provided for manufacturing a micromechanical component. According to the example method, a substrate having a layer system is provided which includes an insulating sacrificial layer, an intermediate layer, and a starting layer. The intermediate layer and the starting layer form a protective structure which partially encloses a sacrificial layer section of the sacrificial layer. It is furthermore provided to form an etch stopping layer structure on the starting layer in the area of the enclosed sacrificial layer section, and to grow a functional layer on the starting layer, which surrounds the etch stopping layer structure. The example method furthermore includes carrying out a trench etching process, in which etch access openings to the sacrificial layer and a trench structure, which reaches the etch stopping layer structure and separates the functional layer into subsections, are formed. In this way, an etching of the starting layer is prevented in the area of the etch stopping layer structure by the etch stopping layer structure. It is furthermore provided to carry out a sacrificial layer etching process for providing a movable mass. The protective structure prevents, in this case, the enclosed sacrificial layer section from being removed completely. In the sacrificial layer etching process, the etch stopping layer structure is removed in such a way that a subarea of the starting layer is exposed. The method furthermore includes cutting through the starting layer in the exposed subarea.

According to the example method, the starting layer is used together with the intermediate layer to protect the sacrificial layer section, which is partially enclosed by these layers, from being removed completely during the sacrificial layer etching. The sacrificial layer section is thus only subjected to a partial or limited removal by etching. The etch stopping layer structure situated on the starting layer in the area of the enclosed sacrificial layer section is used to protect the subarea of the starting layer covered by it (and thus the protective structure formed from the starting and intermediate layers) during the etching process carried out prior to the sacrificial layer etching. The trench etching process, with the aid of which the lateral shape of the (movable) mass may be predefined, is used to form the etch access openings usable during the sacrificial layer etching process and the trench structure. The trench structure which is produced (also) in the area of the etch stopping layer structure and thus in the area of the enclosed sacrificial layer section divides the functional layer grown on the starting layer into separate functional layer sections. After carrying out the sacrificial layer etching during which the movable mass is exposed and the etch stopping layer structure is removed, the functional layer sections are still connected via the starting layer or the subarea of the starting layer which was previously covered by the etch stopping layer structure and is now exposed. Cutting through the starting layer in this subarea results in the starting layer, comparably to the functional layer, being present in the form of separate subsections and thus in the (previously) existing connection of the functional layer sections via the starting layer being interrupted.

Cutting through the starting layer consequently results in an electrical isolation of the functional layer sections. The functional layer sections, however, continue to be mechanically coupled via the insulating sacrificial layer section. The movable mass manufactured according to the example method therefore includes the intermediate layer which is present on the functional layer sections, situated on the associated subsections of the starting layer, and the sacrificial layer section via which a mechanical coupling of the functional layer sections (situated on the starting layer sections) is present.

The example method offers the possibility of forming a micromechanical component having a self-supporting movable mass in a relatively simple manner, a mechanical, but insulating, coupling being present between the individual "elements" or functional layer sections of the mass. The method may furthermore be "integrated" into conventional MEMS manufacturing procedures with relatively little effort. The conventional process sequences may be extended for this purpose insofar as an additional plane or layer in the form of the etch stopping layer structure used for protecting the starting layer during the trench etching is used and an additional step or etching process for cutting through the starting layer is carried out, thus bringing about the electrical isolation.

Generating such an electrically insulating mechanical coupling may prove advantageous with regard to different micromechanical sensors. Acceleration sensors, which are operated using fully differential evaluation circuits, may be considered, for example. In this case, the acceleration sensors have a movably suspended mass according to the above-described structure, i.e., having electrically isolated and mechanically coupled elements which are used as electrodes independently of one another for capacitively detecting a deflection of the mass. Such circuit techniques may contribute to increasing the useful signal of the sensors and to simultaneously suppressing the electrical interference signals as a consequence of the EMC (electromagnetic compatibility) effects or the PSSR (power supply rejection ratio) effects.

Such an insulating coupling of structural elements may also be meaningful for yaw-rate sensors in order to electrically isolate drive and detection elements provided on a movable mass and to make possible a simplified architecture of an associated evaluation circuit based thereon, for example.

In one preferred specific example embodiment of the method, the provision of the substrate having the layer system includes forming a first sacrificial sublayer on the substrate, forming the intermediate layer on the first sacrificial sublayer, and structuring the intermediate layer. Furthermore, a second sacrificial sublayer is formed on the first sacrificial sublayer and the intermediate layer. The second sacrificial sublayer is furthermore structured to provide the sacrificial layer section (taking care of the mechanical coupling). The sacrificial layer section is situated on the intermediate layer in this case. It is furthermore provided to form the starting layer on the intermediate layer and on the second sacrificial sublayer, the protective structure being formed which encloses the sacrificial layer section. In this way, the layer system having the sacrificial layer section enclosed by the protective structure may be produced in a simple and reliable manner.

The previously described structuring of the intermediate layer is preferably carried out in such a way that the intermediate layer includes a planar layer section. On the latter, the sacrificial layer section may be "positioned."

In another preferred specific example embodiment, the protective structure which encloses the sacrificial layer section and is formed from the intermediate layer and the starting layer is only accessible via a predefined opening area. In this way, it may be achieved that the sacrificial layer section which is to be protected and takes care of the insulating coupling is subjected to a relatively minor removal by etching within the scope of the sacrificial layer etching. In this way, an etching medium used in the sacrificial layer etching process may bring about an etching only of the enclosed sacrificial layer section via the opening area of the protective structure.

In another preferred specific embodiment, the sacrificial layer section has a stripe-like shape. Such an elongated shape, which may be produced in a simple manner, may further facilitate the only partial removal of the sacrificial layer section within the scope of the sacrificial layer etching. The mechanical coupling may also be relatively stable, if necessary, as a result.

The etch stopping layer structure, which is provided on the starting layer in the area of the enclosed sacrificial layer section, may have a U-shaped design. Accordingly, the trench structure may also preferably have a U-shaped design in the area of the etch stopping layer structure. With regard to an implementation of the (enclosed) sacrificial layer section having a stripe-like shape, such U shapes of the etch stopping layer structure and the trench structure are, in particular, suitable for establishing the mechanical and electrically insulating coupling between the functional layer sections with great reliability and stability.

In another preferred specific embodiment, the etch access openings are formed in an area outside of the enclosed sacrificial layer section. In this way, it may (also) be achieved that an etching attack of the sacrificial layer section enclosed by the protective structure may take place only in a limited manner during the sacrificial layer etching.

In another preferred specific embodiment, the layer system situated on the substrate has multiple protective structures which are formed from the intermediate layer and the starting layer and which each enclose a sacrificial layer section. In such an embodiment, the above-described processes may also be carried out in a similar manner, i.e., in the present case, forming etch stopping layer structures on the starting layer in the area of the enclosed sacrificial layer sections (in each case); growing a functional layer, which surrounds the etch stopping layer structures, on the starting layer; carrying out a trench etching process, etch access openings and a trench structure, which reaches the etch stopping layer structures and separates the functional layer into subsections, being formed; carrying out a sacrificial layer etching process for providing a movable mass, the protective structures preventing the enclosed sacrificial layer sections from being removed completely, and the etch stopping layer structures being removed, thus exposing the previously covered subareas of the starting layer; and cutting through the starting layer in the exposed subareas. In this way, multiple mechanical coupling points may be implemented in the form of multiple (only slightly etched) sacrificial layer sections via which the functional layer sections, which are separated by the trench structure, may be mechanically connected. In this way, the stability of the mechanical coupling may be (further) enhanced.

In this regard, it is preferably provided that the trench structure has a meandering shape. This type of shape of the trench structure allows the functional layer sections separated by the trench structure to mesh in a comb-like manner and it may be provided that the mechanical coupling points are situated next to one another. Such a structure may further enhance the stability of the coupling.

According to the present invention, a micromechanical component is furthermore proposed which has a substrate and a mass situated movably on the substrate. The movable mass has an intermediate layer, an insulating sacrificial layer section situated on the intermediate layer, a starting layer, and a functional layer grown on the starting layer. Here, the functional layer and the starting layer are divided into subsections, which are separated from one another by a trench structure. The separated subsections of the functional and the starting layers are situated on the sacrificial layer section.

In the micromechanical component, the subsections of the functional and the starting layers are separated from one another by the trench structure and thus electrically isolated. The subsections are, however, mechanically coupled via the insulating sacrificial layer section which is situated on the intermediate layer and on which these subsections are situated. Such a structure may be implemented in a relatively simple manner, in particular by carrying out the above-described manufacturing method or one of the described specific embodiments.

Advantageous example embodiments and refinements of the present invention explained above and/or below—except for the cases of unambiguous contingencies or incompatible alternatives, for example—may be used alone or also in any combination with each other.

The present invention is explained below in greater detail with reference to the figures.

DETAILED DESCRIPTION OF EXAMPLE EMBODIMENTS

Based on the following figures, a simple and reliable method is described for manufacturing a micromechanical component 200 having a movable and deflectable mass. The movable mass, which may also be referred to as a seismic mass, includes mechanically coupled, but electrically isolated, structural elements. During the manufacturing process, processes, e.g., CMOS (complementary metal oxide semiconductor) processes and MEMS processes, which are customary in the semiconductor or microsystem technology, may be carried out, and customary materials may be used, so that this will be discussed only partially. It is also pointed out that in addition to the illustrated and described method steps and processes, other method steps may be carried out to complete the manufacture of micromechanical component 200.

To illustrate the manufacturing process, FIGS. 1 through 28 show sections of lateral sectional illustrations and top view illustrations of a substrate at different process stages. Associated section lines are identified by "A-A" and "B-B." The method steps carried out in the method are also combined in the flow chart of FIG. 29 which is also used as reference in the following.

Figure 1:
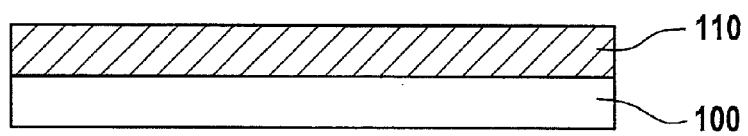
FIGS. 1 through 3 show different illustrations of a substrate having a first sacrificial sublayer situated on the substrate.
Figure 2:
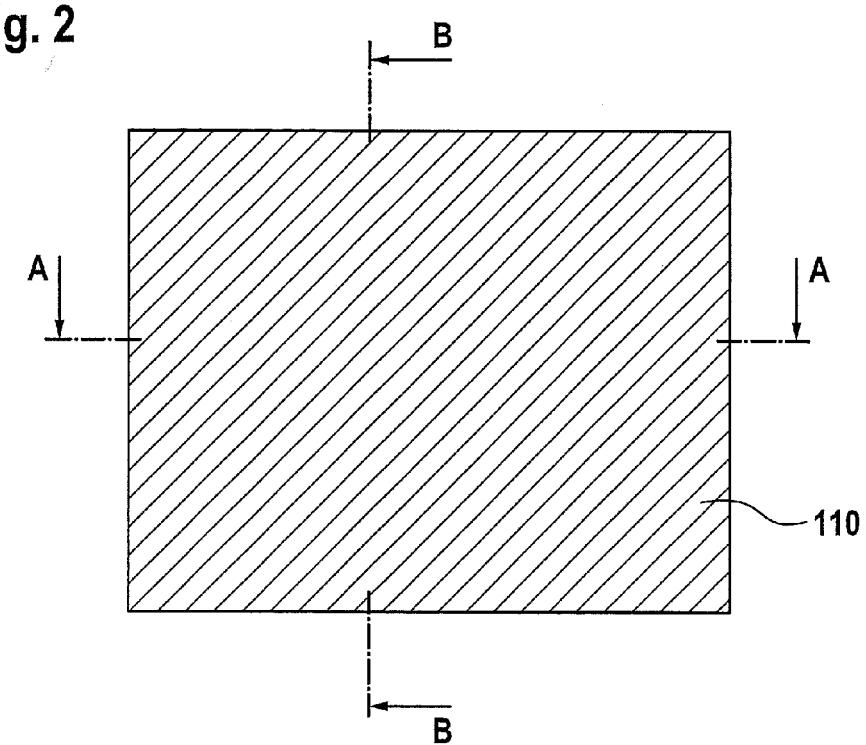
Figure 3:
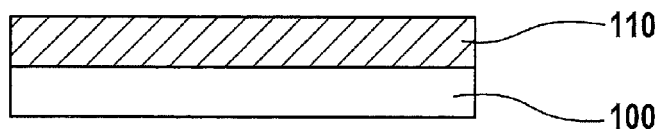
Figure 29:
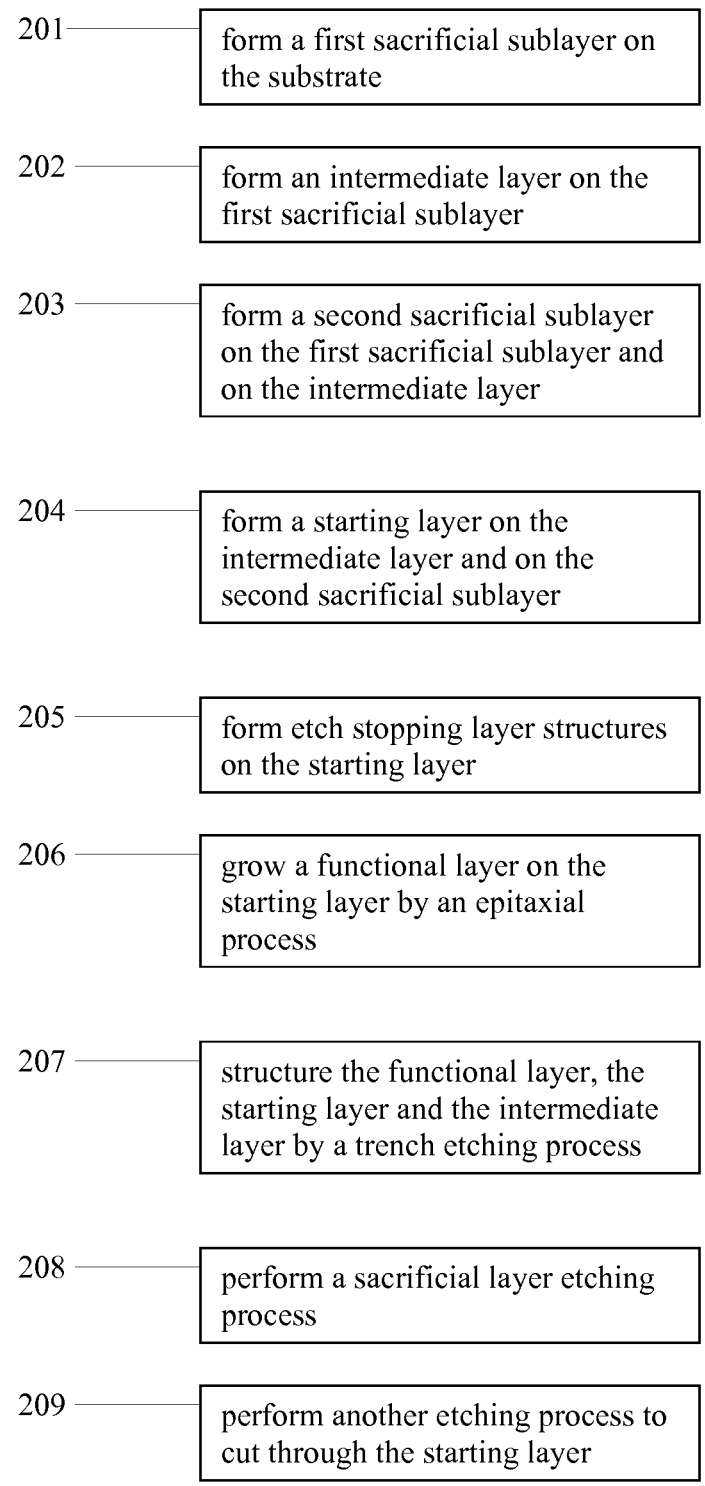
FIG. 29 shows a flow chart of a method for manufacturing a micromechanical component.

At the beginning of the method, a first sacrificial sublayer 110 is formed on a provided substrate 100 in a step 201 (cf. FIG. 29). Sectional illustrations of substrate 100 coated in such a way are shown in FIGS. 1 and 3, and an associated top view is shown in FIG. 2. Substrate 100 may be a silicon substrate or a silicon wafer, for example. Sacrificial sublayer 110 has an insulating material, in particular an oxide material or silicon oxide. The application of sacrificial sublayer 110 on substrate 100 may, for example, be carried out with the aid of a CVD (chemical vapor deposition) process.

Figure 4:
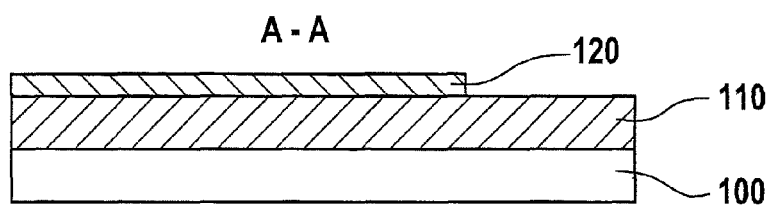
FIGS. 4 through 6 show different illustrations of the substrate after the formation of a structured intermediate layer.

In a subsequent step 202 (cf. FIG. 29), which is explained with reference to FIGS. 4 through 6, an intermediate layer 120 is formed on first sacrificial sublayer 110. Intermediate layer 120 is also subjected to a structuring. Intermediate layer 120 has a conductive material, in particular (doped) polysilicon. The deposition of intermediate layer 120 on sacrificial sublayer 110 may, for example, take place within the scope of a CVD process. For structuring, a structuring or etching process may, for example, be carried out using a photoresist mask. Since intermediate layer 120 is buried in the course of the manufacturing process and is usable as a printed conductor plane, intermediate layer 120 may also be referred to as a "buried printed conductor."

Figure 5:
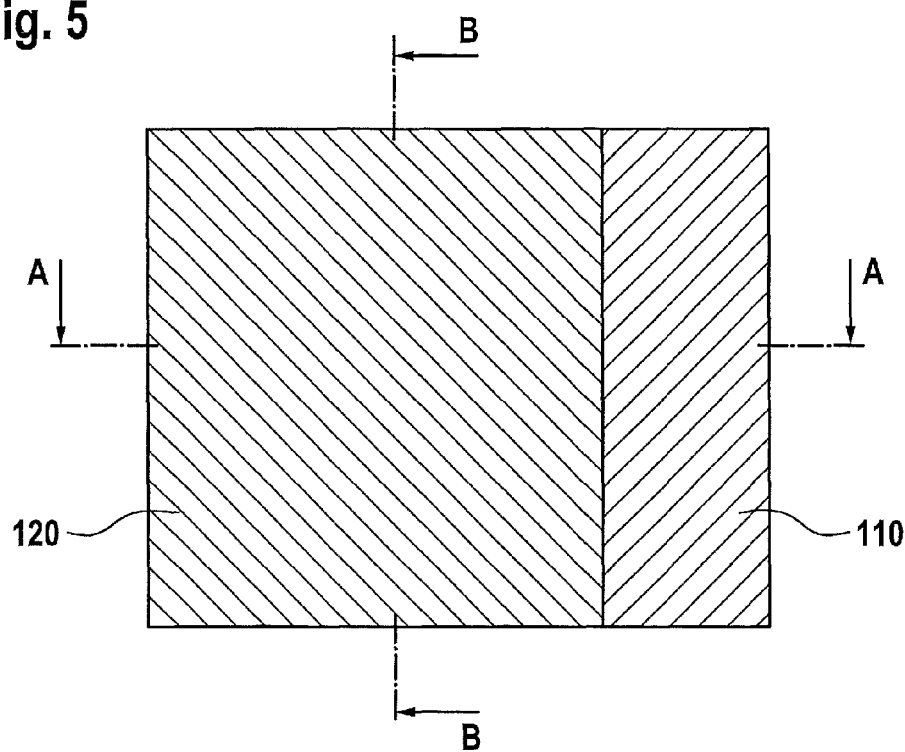
Figure 6:
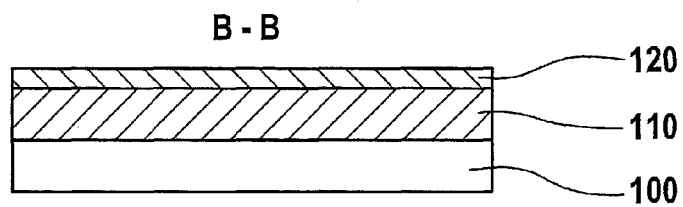

Based on the top view illustration of FIG. 5, it becomes apparent that, after the structuring, intermediate layer 120 includes a planar layer section so that first sacrificial sublayer 110 is (again) exposed in a contiguous planar subarea. In addition to the planar layer section, intermediate layer 120 may include another structure in a different place (not shown), e.g., a narrow printed conductor structure contiguous to the planar layer section.

Figure 7:
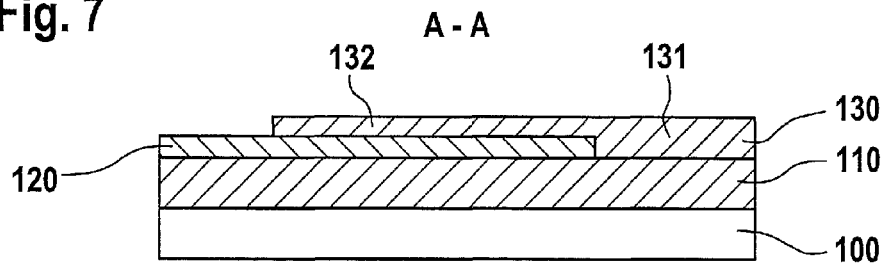
FIGS. 7 through 9 show different illustrations of the substrate after the formation of a structured second sacrificial sublayer.

Subsequently hereto, in another step 203 (cf. FIG. 29) which is illustrated based on FIGS. 7 through 9, a second insulating sacrificial sublayer 130 is formed on first sacrificial sublayer 110 and intermediate layer 120, and subjected to a structuring. Second sacrificial sublayer 130, which forms a joint sacrificial layer structure together with first sacrificial sublayer 110, has the same material as first sacrificial sublayer 110, i.e., in particular an oxide material or a silicon oxide. The deposition may be carried out with the aid of a CVD process, for example, and the structuring with the aid of a photoresist mask, for example.

Figure 8:
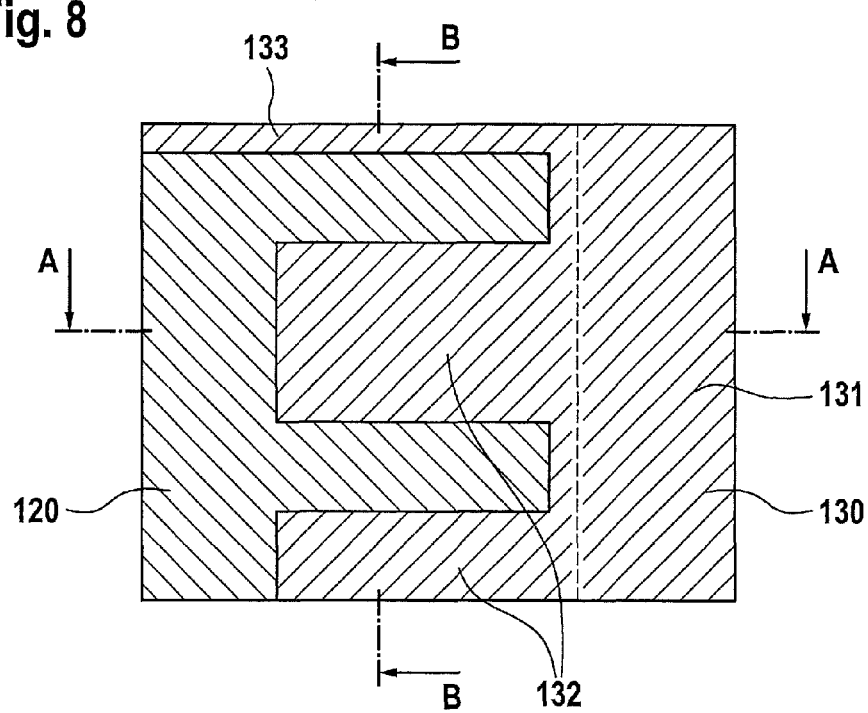

Based on the top view illustration of FIG. 8, it becomes apparent that structured second sacrificial sublayer 130 includes a comb-like structure having a planar basic section 131 and multiple stripe- or finger-like sections 132. Via stripe-like sacrificial layer sections 132, the insulating mechanical coupling is enabled between the elements of the seismic mass to be manufactured, as will be described below in greater detail. Stripe-like sacrificial layer sections 132, which have a rectangular contour, extend from basic section 131 and are situated in parallel next to one another and are spaced apart from one another. In FIG. 8, but also in FIG. 9, two stripe-like sacrificial layer sections 132 are illustrated, one of which is illustrated only partially. Apart from the two shown sacrificial layer sections 132, a larger number of such sections 132 may also be provided.

Stripe-like sacrificial layer sections 132 of second sacrificial sublayer 130 are situated on intermediate layer 120 or on the planar section of intermediate layer 120. Basic section 131 of second sacrificial sublayer 130 may also be situated partially on intermediate layer 120, as illustrated in FIG. 8 based on the edge contour of intermediate layer 120 indicated as a dashed line. The edge of intermediate layer 120 is also indicated in the subsequent figures which also refer to the top view illustration.

Both intermediate layer 120 and second sacrificial sublayer 130 situated on first sacrificial sublayer 110 may have a step-like cross-sectional shape in the edge area of intermediate layer 120. For the sake of clarity, second sacrificial sublayer 130 is, however, illustrated in FIG. 7 without such a step-like shape and thus having a flat surface area. This illustration is also maintained in the following figures which refer to section line A-A.

Figure 9:
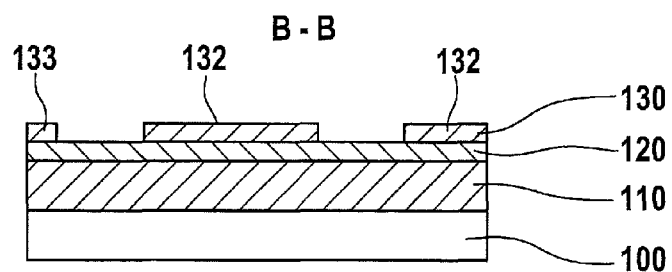

As furthermore shown in FIGS. 8 and 9, second sacrificial sublayer 130 may include laterally from the system of stripe-like sacrificial layer sections 132 an additional section 133 which extends from section 131 and is situated on intermediate layer 120. This section 133 is removed again at a later process stage. A comparable or symmetric structure having a second section 133 of this type may also be provided on an opposite side of the system of stripe-like sacrificial layer sections 133 (not illustrated).

Figure 10:
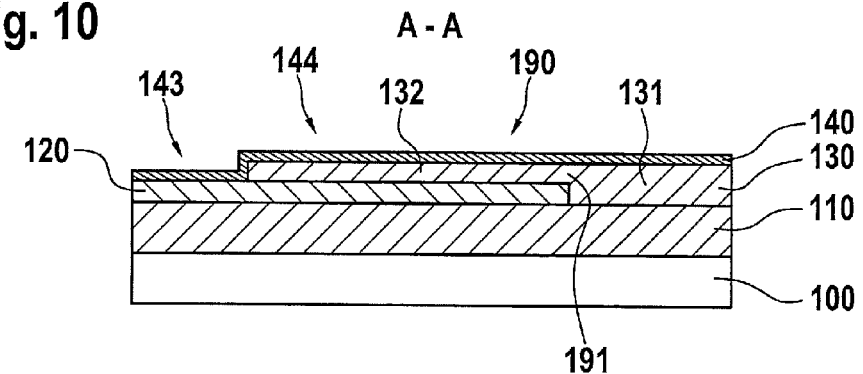
FIGS. 10 through 12 show different illustrations of the substrate after the formation of a starting layer.
Figure 11:
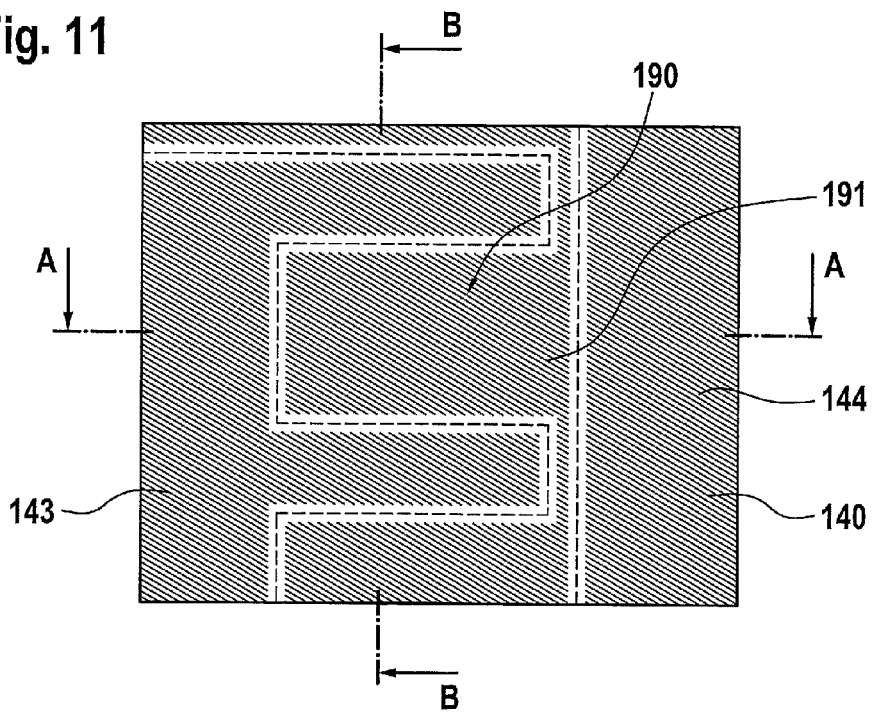
Figure 12:
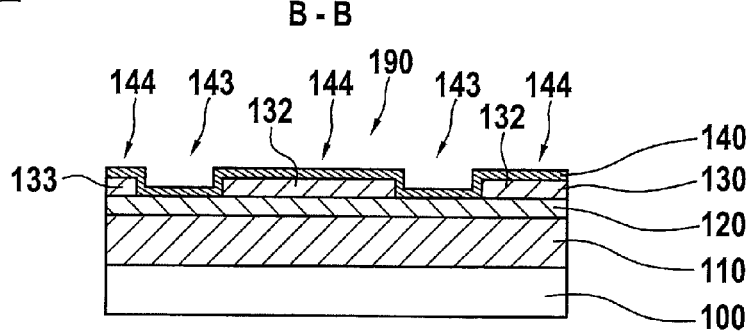

After the formation of second sacrificial layer 130, a relatively thin starting layer 140 is formed on intermediate layer 120 and on second sacrificial sublayer 130 in another step 204 (cf. FIG. 29), whereby these layers 120, 130 are completely covered, as illustrated in FIGS. 10 through 12. Starting layer 140 with whose aid an epitaxial growth of a functional layer is enabled at a later process stage has a conductive material, in particular (doped) polysilicon. The application of starting layer 140 may take place within the scope of a CVD process, for example.

Due to the comb-like shape of second sacrificial sublayer 130 formed previously, starting layer 140 has a comparable structure and consequently a comb-like area 143 situated on intermediate layer 120 and a comb-like area 144 situated on second sacrificial sublayer 130. This structure is indicated in the top view illustration of FIG. 11 (and also in the subsequent figures) based on the dashed lines. At the transition between areas 143, 144, starting layer 140 has a step-like contour in each case, as also shown in the sectional illustrations of FIGS. 10 and 12. Second sacrificial sublayer 130 is therefore surrounded at its edge by starting layer 140 in a step-like manner.

In the case of such an implementation, starting layer 140 forms together with intermediate layer 120 a structure 190 which encloses the sacrificial layer section 132 in question for each of stripe-like sacrificial layer sections 132 of second sacrificial sublayer 130. Structures 190 which enclose sacrificial layer sections 132 are used to prevent sacrificial layer sections 132 from being removed completely during a sacrificial layer etching carried out at a later point in time and are therefore referred to in the following as protective structures 190. In this case, protective structures 190 each have an opening area 191 at the transition between basic section 131 and stripe-like sacrificial layer sections 132 (cf. FIGS. 10 and 11) due to the shape of second sacrificial sublayer 130. According to the stripe-like contour of enclosed sacrificial layer sections 132, protective structures 190 also have a stripe-like shape or the shape of a rectangle or cuboid, an opening area 191 being present (only) on an edge side of such a protective structure 190.

Figure 13:
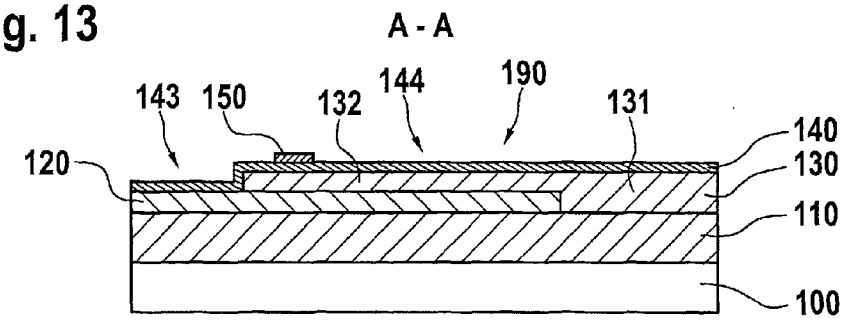
FIGS. 13 through 15 show different illustrations of the substrate after the formation of etch stopping structures.
Figure 14:
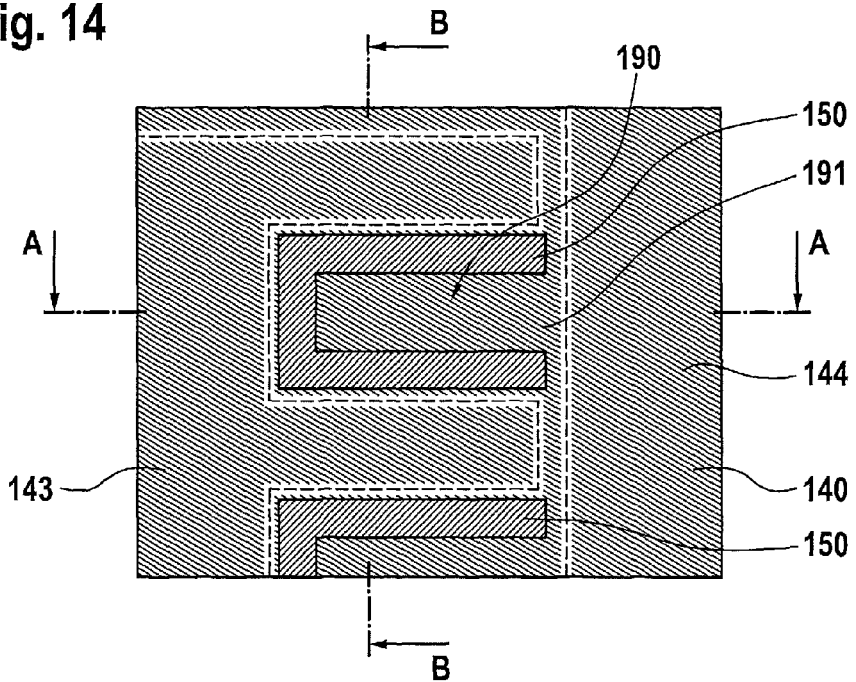
Figure 15:
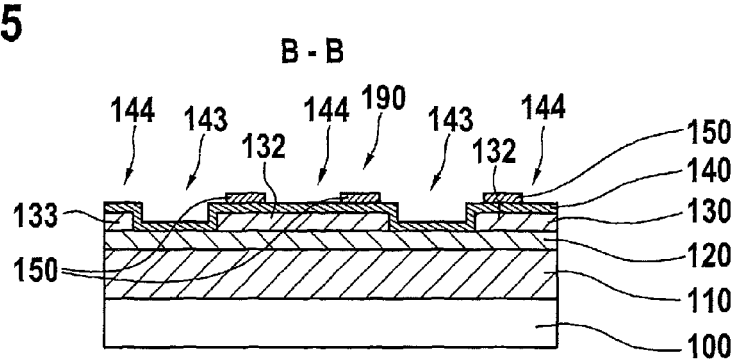

After the formation of starting layer 140, a number of etch stopping layer structures 150 is formed on starting layer 140 in another step 205 (cf. FIG. 29) which is illustrated based on FIGS. 13 through 15. Etch stopping layer structures 150 are situated in area 144 of starting layer 140 present on second sacrificial sublayer 130 and are thus situated in the area of protective structures 190 or in the area (above) of enclosed sacrificial layer sections 132.

Etch stopping layer structures 150, each of which covers a subarea of starting layer 140, are used to protect starting layer 140 (and thus protective structures 190) in the covered subareas against an etching attack during a trench etching process carried out at a later point in time. In the top view, etch stopping layer structures 150 are U-shaped (cf. FIG. 14). This shape is matched to the stripe-like (rectangular) contour of enclosed sacrificial layer sections 132 or to the corresponding shape of protective structures 190, so that the external dimensions of etch stopping layer structures 150 essentially correspond to the external dimensions of an enclosed sacrificial layer section 132 or a protective structure 190. Etch stopping layer structures 150 may, in this case, be situated in a (slightly) inwardly offset manner with regard to the "steps" of starting layer 140 present in the area of sacrificial layer sections 132, as illustrated in FIGS. 13 through 15. For the formation of etch stopping layer structures 150, a layer made of an insulating material, in particular the same material as the one used for sacrificial sublayers 110, 130, i.e., in particular an oxide material, is deposited on starting layer 140, for example, by carrying out a CVD process, and a structuring is subsequently carried out with the aid of a photoresist mask, for example.

Figure 16:
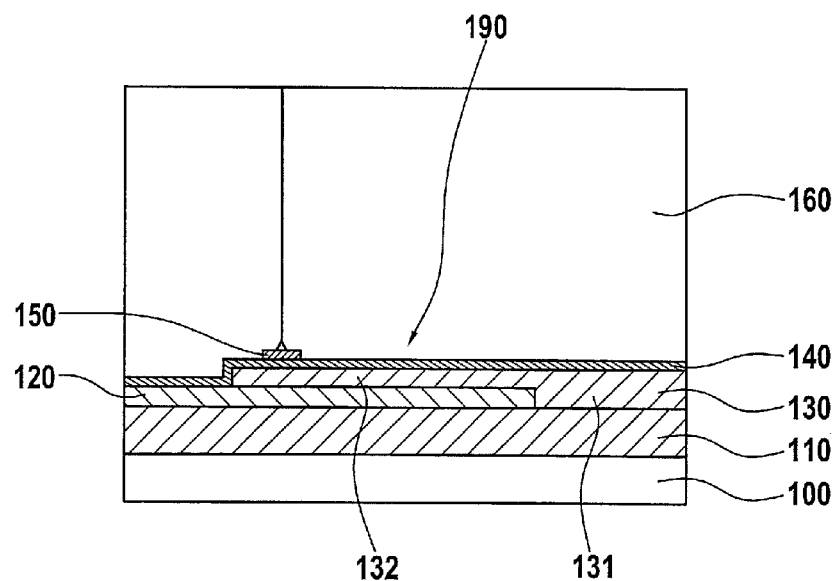
FIGS. 16 through 18 show different illustrations of the substrate after the formation of a functional layer.
Figure 17:
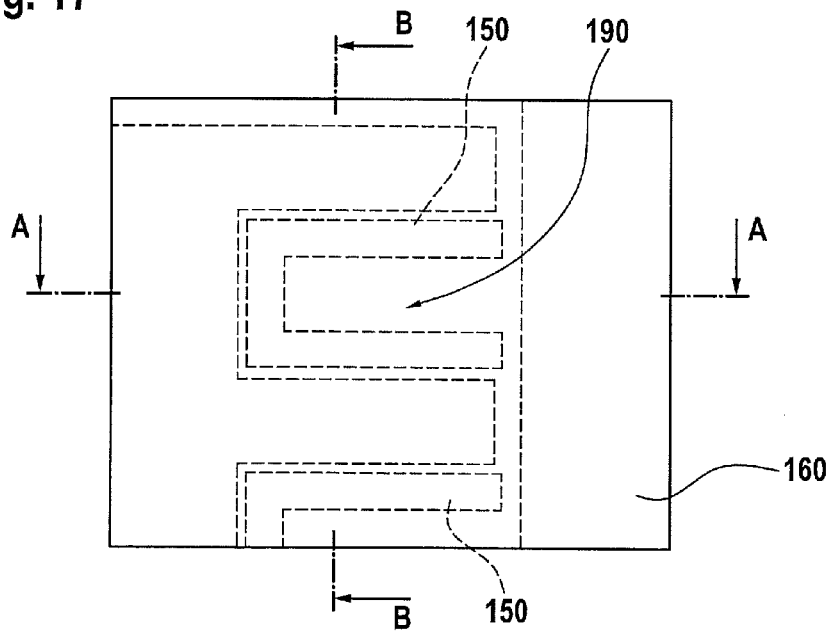
Figure 18:
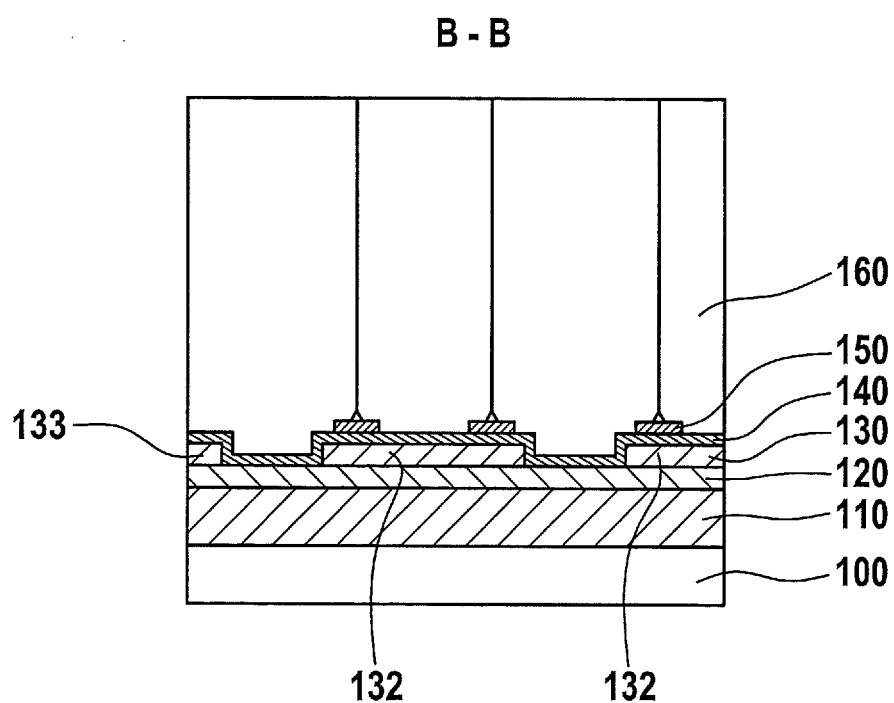

Subsequently, a relatively thick functional layer 160 is grown on starting layer 140 by carrying out an epitaxial process in another step 206 (cf. FIG. 29), which is illustrated based on FIGS. 16 through 18. Functional layer 160, which may also be referred to as an "epitaxially stabilized" layer, has the same material as starting layer 140, i.e., in particular a polysilicon in the present case. Functional layer 160 is also designed to be conductive, which may be implemented by a corresponding doping.

Etch stopping layer structures 150 formed previously are generally completely surrounded by functional layer 160. Etch stopping layer structures 150 are indicated in the top view illustration of FIG. 17 (and also in the following figures) based on the dashed lines. As illustrated in FIGS. 16 and 18, relatively small cavities may be present above etch stopping layer structures 150 enclosed by functional layer 160. Above that and in particular in the area of the surface of functional layer 160, functional layer 160 is, however, in turn grown together, so that functional layer 160 has a planar surface in this area.

Figure 19:
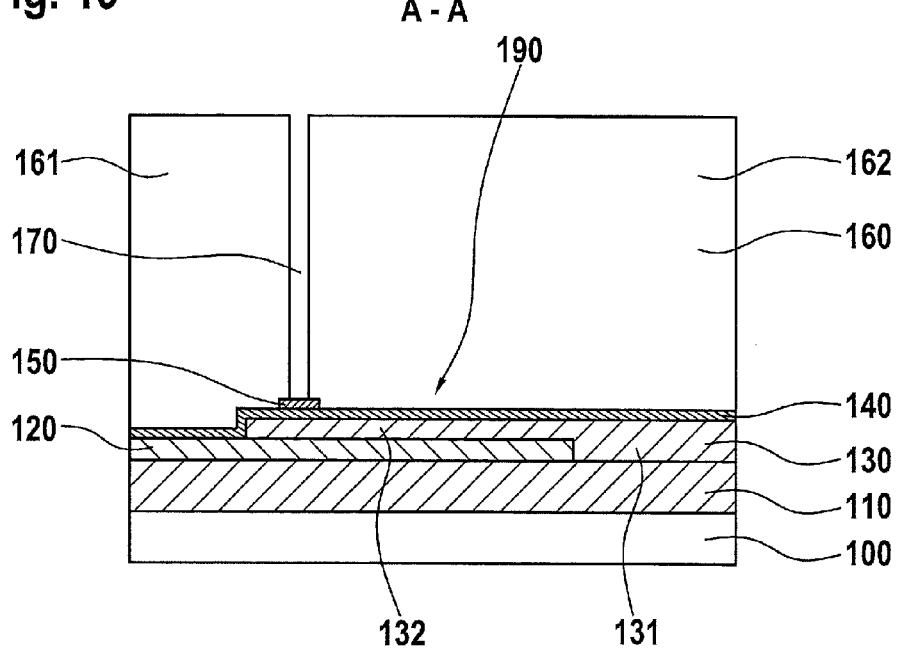
FIGS. 19 through 21 show different illustrations of the substrate after carrying out a trench etching process.
Figure 20:
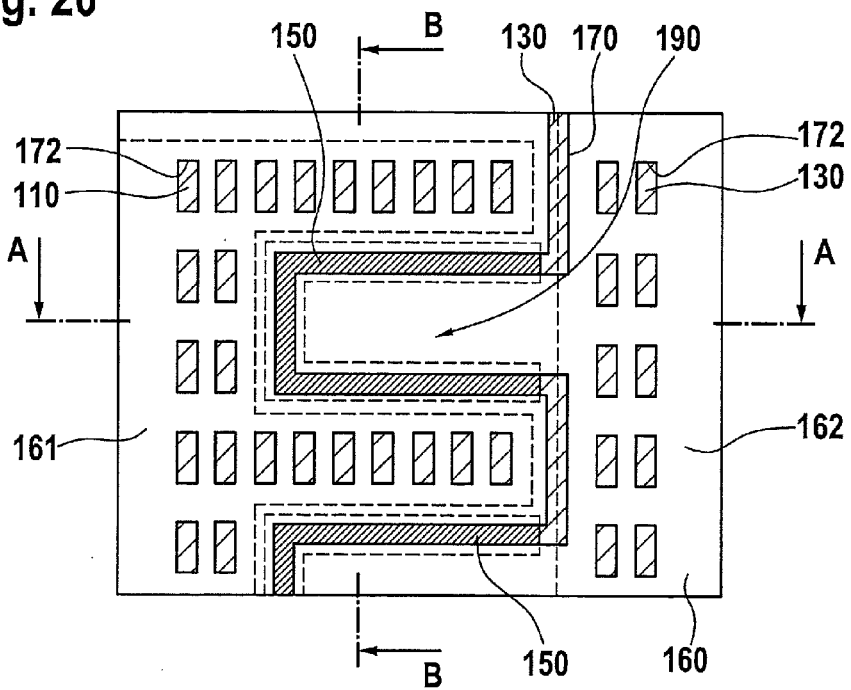
Figure 21:
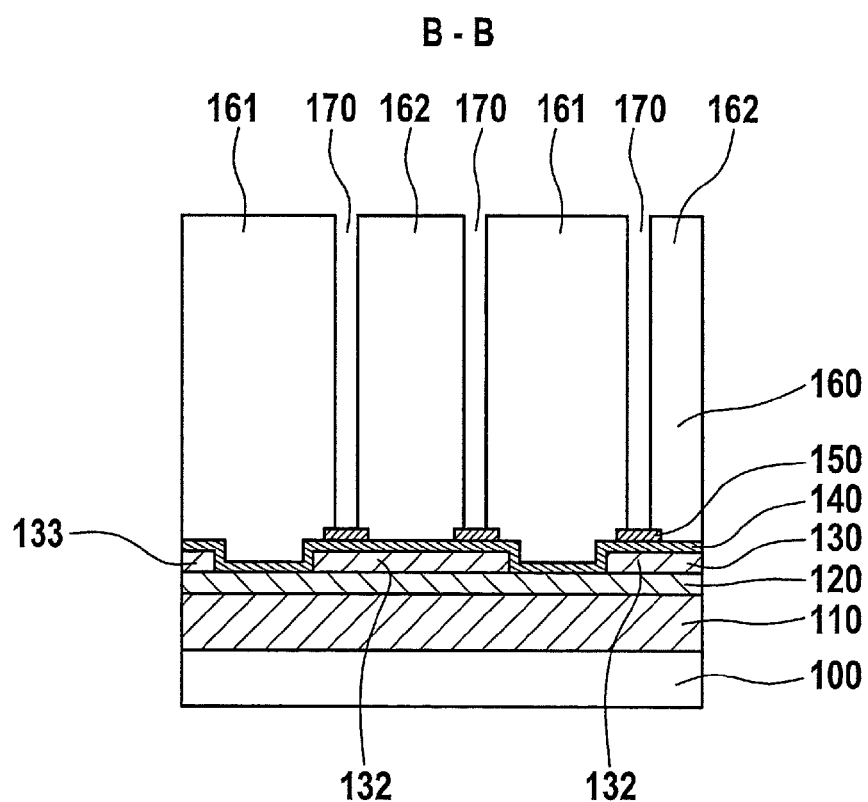

In a subsequent step 207 (cf. FIG. 29), which is illustrated based on FIGS. 19 through 21, a trench etching process is carried out for structuring functional layer 160, starting layer 140, and intermediate layer 120. In this way, the lateral shape of a seismic mass including these layers, as well as suspension or spring structures (not illustrated) which are provided for suspending the seismic mass on substrate 100, may be established; furthermore, a trench structure 170 and etch access openings 172 are formed.

The trench etching may be carried out with the aid of an anisotropic etching process, in particular a deep reactive ion etching (DRIE) process such as the so-called Bosch process. For this purpose, a corresponding etching mask, e.g., a photoresist mask (not illustrated), is formed on functional layer 160. The trench etching is carried out in such a way that functional layer 160, starting layer 140, and intermediate layer 120, which may (all) be made of polysilicon, in particular, are etched selectively with regard to the other layers, in particular the ones including oxide, i.e., etch stopping layer structures 150 and sacrificial sublayers 110, 130. In other words, the trench etching process may be stopped at these layers 110, 130, 150.

Trench structure 170 produced within the scope of the trench etching process has a meandering shape as shown in the top view illustration of FIG. 20 and divides functional layer 160 into comb-like subsections 161, 162 ("epitaxial blocks") which are separated from one another. Subsections

161, 162 have meshing rectangular structural elements. Meandering trench structure 170 extends in the area of etch stopping layer structures 150 provided above stripe-like sacrificial layer sections 132 and therefore has a U-shaped trench section on every U-shaped etch stopping layer structure 150 matched thereto. At these points, trench structure 170 reaches etch stopping layer structures 150, thus (partially) exposing them. Outside of etch stopping layer structures 150 or contiguously to the U-shaped trench sections, trench structure 170 has trench sections which run linearly or "in a straight line" and which may extend above the edge (indicated as a dashed line) of intermediate layer 120, as shown in FIG. 20. At these points, second sacrificial sublayer 130 is exposed.

During the trench etching or production of trench structure 170, etch stopping layer structures 150 are used to protect the respective subarea of starting layer 140 covered thereby and thus protective structures 190 formed from starting layer 140 and intermediate layer 120 ("trench stop"). For this to take place very reliably, it is furthermore provided to form trench structure 170, (at least) in the area of etch stopping layer structures 150, to have a trench width which is smaller than a width of etch stopping layer structures 150. This results in etch stopping layer structures 150 being exposed only partially (i.e., except for an edge area). In this way, it is possible to prevent very reliably an "etching beyond" surrounding etch stopping layer structures 150 and thus etching of starting layer 140 in these areas. Outside of etch stopping layer structures 150, i.e., in the area of the linearly extending trench sections, starting layer 140 is removed in addition to functional layer 160, so that at these points of trench structure 170 second sacrificial sublayer 130 is exposed, as described above.

Within the scope of the trench etching, etch access openings 172 (cf. FIG. 20) are additionally formed which penetrate functional layer 160, starting layer 140, and (partially) intermediate layer 120 and thus reach sacrificial sublayers 110, 130. These etch access openings are in an area outside of enclosed stripe-like sacrificial layer sections 132 in order to not impair starting layer 140, which later acts as a "buffer layer" in the area of sacrificial layer sections 132, and thus protective structures 190. Through etch access openings 172, first or lower sacrificial sublayer 110 is exposed in the area of functional layer section 161, and second or upper sacrificial sublayer 130 is exposed in the area of the other functional layer section 162.

Subsequently, a sacrificial layer etching process is carried out in another step 208 (cf. FIG. 29), which is illustrated based on FIGS. 22 through 24, whereby the seismic mass may be exposed. For this purpose, an isotropic etching process is carried out using an appropriate etching medium, the etching medium being able to reach sacrificial sublayers 110, 130 via etch access openings 172 (and also trench structure 170). One example is a vapor phase etching process using hydrofluoric acid vapor as the etching medium. The etching medium is selected in such a way that sacrificial sublayers 110, 130, made of an oxide material, in particular, and also etch stopping layer structures 150, made of the same material, may be etched selectively with regard to functional layer 160, starting layer 140, and intermediate layer 120.

Figure 22:
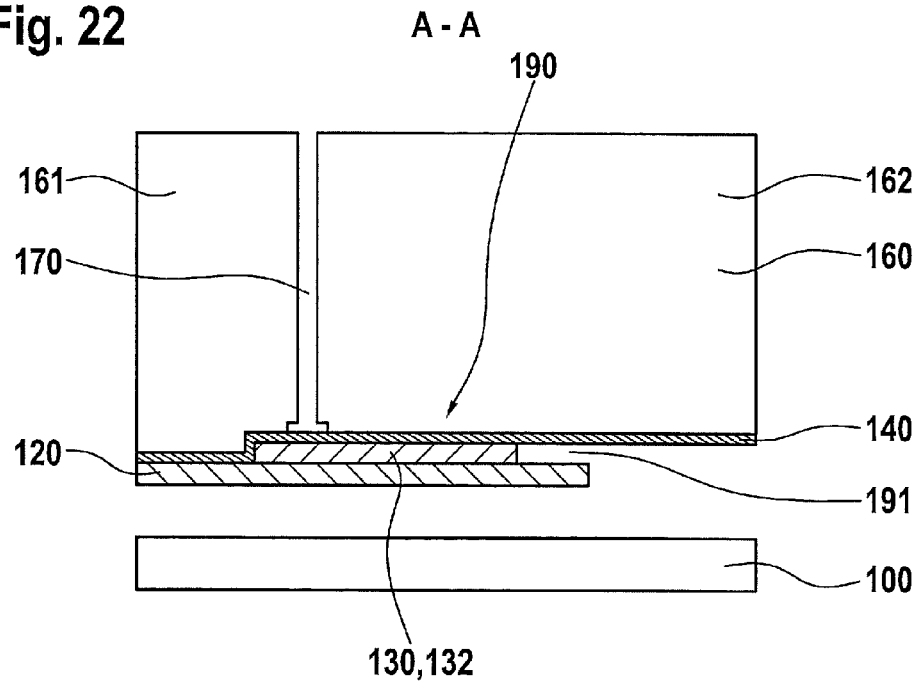
FIGS. 22 through 24 show different illustrations of the substrate after carrying out a sacrificial layer etching process.
Figure 23:
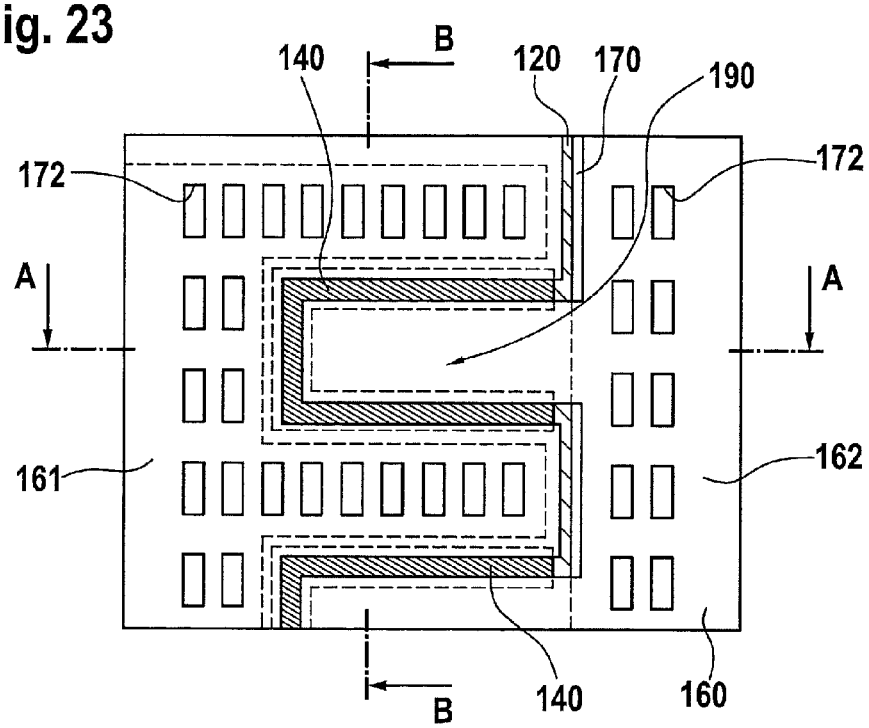
Figure 24:
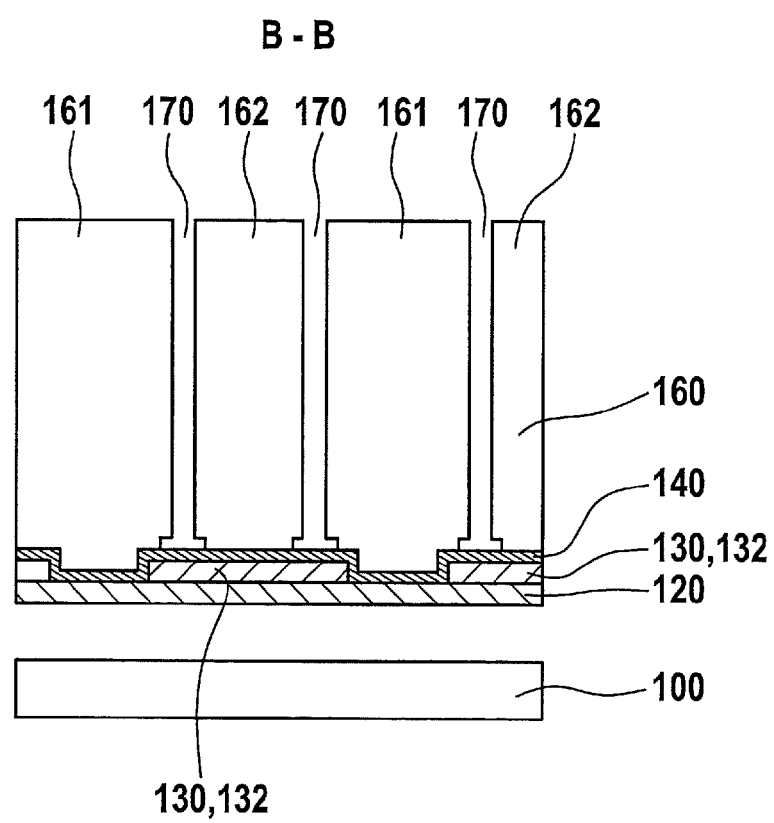

As illustrated in FIGS. 22 and 24, sacrificial sublayers 110, 130 are completely removed in the partial detail illustrated in the figures except for sacrificial layer sections 132 enclosed by protective structures 190. A complete removal may thus also apply to section(s) 133 of sacrificial sublayer 130 (cf. FIGS. 21 and 24). Within the scope of the sacrificial layer etching, the seismic mass which is situated on substrate 100 and includes layers 120, 140, 160 is homogeneously undercut via etch access openings 172 and is thus movable. A suspension of the mass on substrate 100 may be implemented at another point with the aid of the above-mentioned suspension or spring structures (not illustrated).

During the sacrificial layer etching, stripe-like sacrificial layer sections 132 are protected by enclosing protective structures 190, which are formed from starting layer 140 and intermediate layer 120, from being removed completely. Sacrificial layer sections 132 are therefore subjected only to a relatively minor removal by etching, as becomes apparent based on FIG. 22. Here, protective structures 190 are only accessible via opening areas 191 situated on one side of protective structures 190, whereby the used etching medium (hydrofluoric acid vapor) may only bring about a limited removal by etching of enclosed sacrificial layer sections 132. The relatively minor removal by etching is furthermore facilitated by elongated stripe-like sacrificial layer sections 132 which may only be etched in one direction or in the longitudinal direction starting from opening areas 191.

Within the scope of the sacrificial layer etching process, etch stopping layer structures 150 are also removed so that the subareas of starting layer 140 are exposed which were previously covered by etch stopping layer structures 150. In the top view illustration shown in FIG. 23, starting layer 140 is visible in the area of the U-shaped trench sections of trench structure 170 (instead of etch stopping layer structures 150). In the linear trench sections adjoining it, intermediate layer 120 or its edge is visible.

After carrying out the sacrificial layer etching process, subsections 161, 162 of functional layer 160, which are separated from one another by trench structure 170, are still connected via starting layer 140 or the now exposed subareas of starting layer 140. In this way, an electrical connection is (still) present between the two functional layer sections 161, 162.

Figure 25:
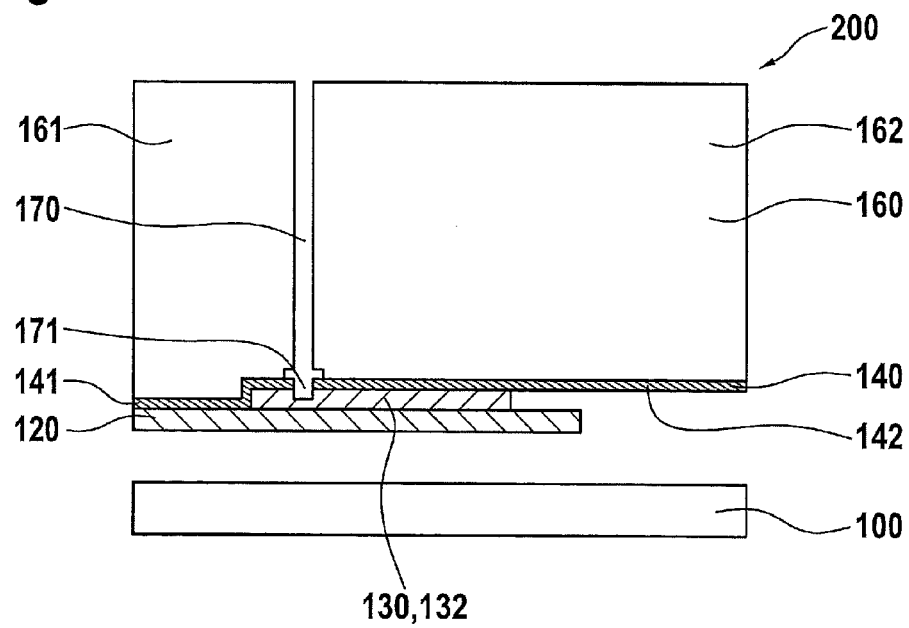
FIGS. 25 through 27 show different illustrations of the substrate after cutting through the starting layer.
Figure 26:
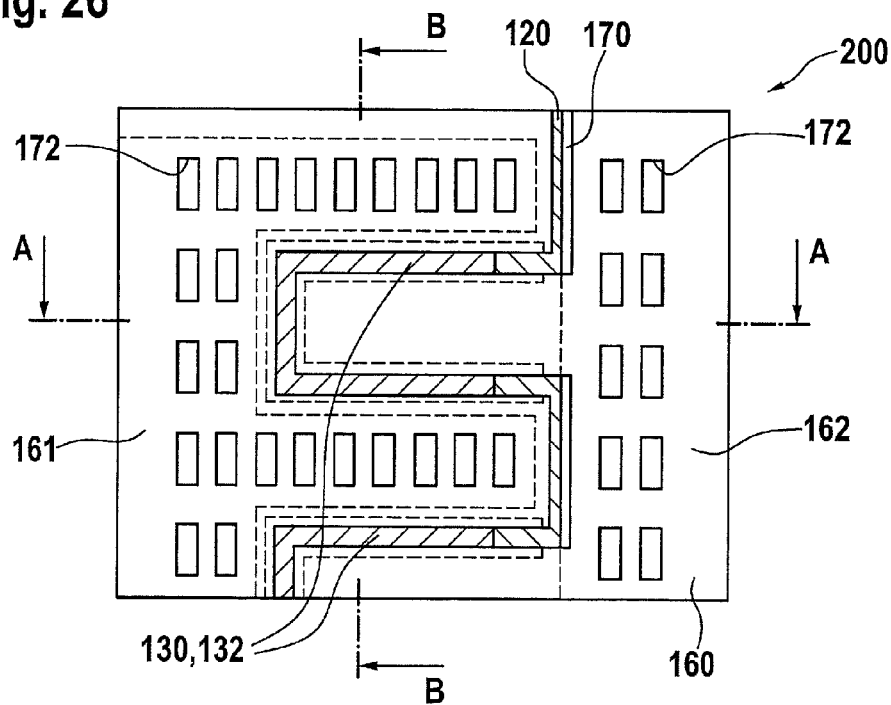
Figure 27:
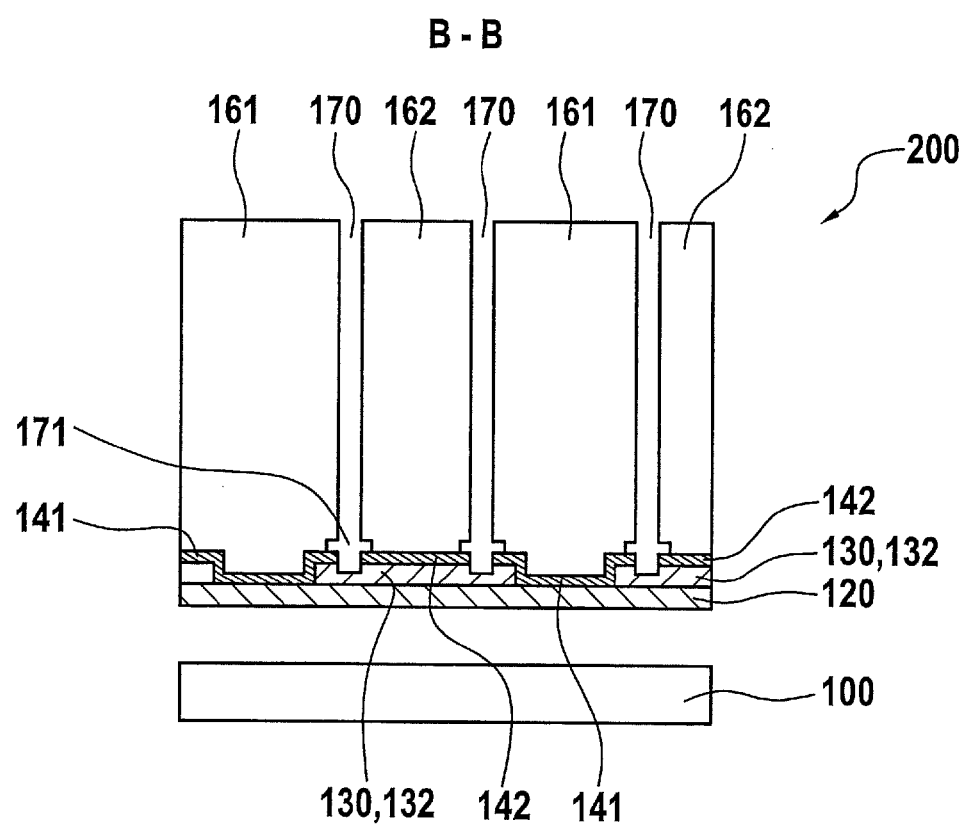

In a subsequent step 209 (cf. FIG. 29), which is illustrated based on FIGS. 25 through 27, another etching process is thus carried out to remove starting layer 140 in the area of the exposed subareas and thereby cut through it. It is achieved thereby that starting layer 140, comparably to functional layer 160, is present in the form of two separated subsections 141, 142, on each of which associated subsections 161, 162 of functional layer 160 are situated. Cutting through starting layer 140 thus results in the connection between functional layer sections 161, 162, which (previously) existed via starting layer 140, being interrupted. This is associated with an electrical isolation of subsections 141, 142 of starting layer 140, and thus of associated functional layer sections 161, 162, which are, however, still connected mechanically via sacrificial layer sections 132.

Cutting through starting layer 140 may, for example, be carried out with the aid of a back-etching or another trench etching process, or alternatively with the aid of a sputter etching process. Due to the small thickness of starting layer 140, such a process may be carried out within a relatively short period of time. Cutting through starting layer 140 results in etch openings 171 being produced, which may be understood as an "extension" of trench structure 170, as is shown in the sectional illustrations of FIGS. 25 and 27. In this case, a mild etching attack of sacrificial sublayer 130 or its associated sacrificial layer sections 132 situated below starting layer 140 may also take place, as is also indicated in FIGS. 25 and 27.

In the top view illustration of FIG. 26, sacrificial sublayer 130 or the particular subarea of associated sacrificial layer sections 132 is visible in the area of the U-shaped trench sections of trench structure 170 (instead of removed starting layer 140). Since only a (small) portion of sacrificial layer sections 132 is etched during the previously carried out sacrificial layer etching, a larger portion of intermediate layer 120 above trench structure 170 is visible in FIG. 26 as compared to FIG. 23 (cf. also FIG. 28).

After cutting through starting layer 140, other processes may be carried out, if necessary, for completing micromechanical component 200 to form additional structures and/or layers on substrate 100, for example. This will not be discussed in greater detail. Furthermore, carrying out separation processes to separate component 200 may also be considered.

The seismic mass of component 200 includes intermediate layer 120, insulating sacrificial layer sections 132 which are situated on intermediate layer 120, subsections 141, 142 of starting layer 140, and associated subsections 161, 162 of functional layer 160 situated thereon. For this purpose, subsections 141, 161 of starting layer 140 and functional layer 160 are electrically isolated from other subsections 142, 162 of starting layer 140 and functional layer 160 by trench structure 170 which is "extended" by etch openings 171. Subsection 141 of starting layer 140 is situated on intermediate layer 120 and also on insulating sacrificial layer sections 132. The other subsection 142 of starting layer 140 is, however, situated only on sacrificial layer sections 132. In this way, electrically isolated subsections 141, 142 of starting layer 140, and thus associated functional layer sections 161, 162 are mechanically coupled to one another.

Figure 28:
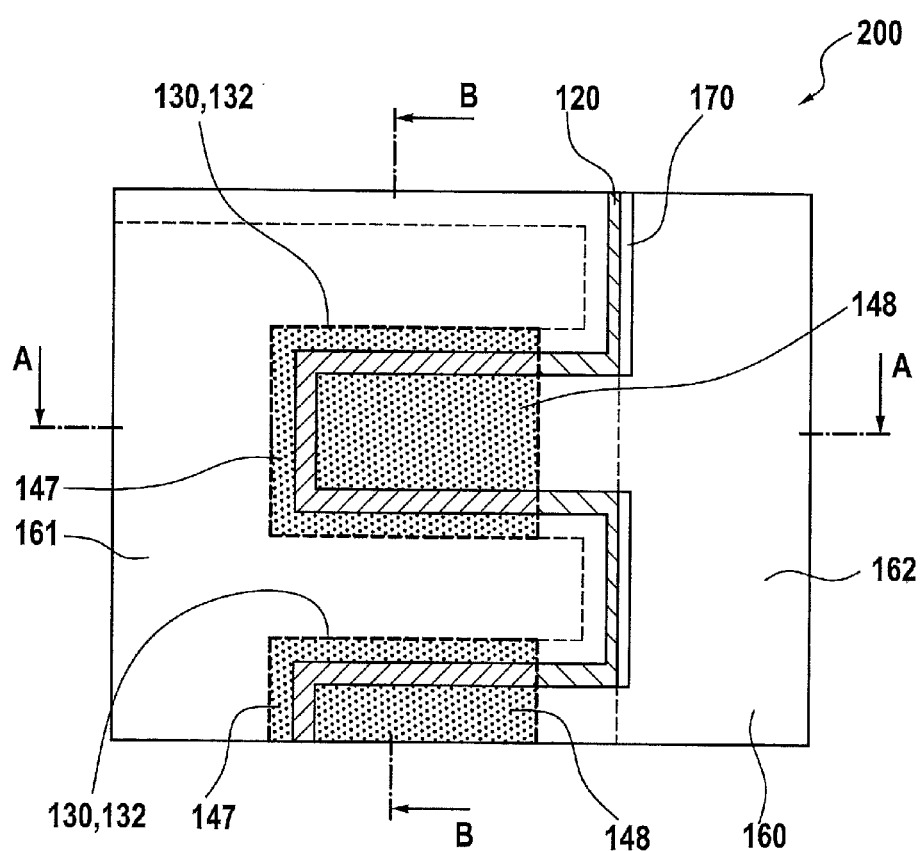
FIG. 28 shows a schematic top view illustration of the substrate, corresponding to FIG. 26, in which connecting areas of subsections of the cut-through starting layer having sacrificial layer sections are illustrated.

To better illustrate this contingency, FIG. 28 shows a schematic top view illustration of component 200 (without etch access openings 172), which corresponds to FIG. 26 and in which the position of sacrificial layer sections 132 is illustrated which are (partially) covered by subsections 141, 142, 161, 162 of starting and functional layers 140, 160. In this illustration, connecting areas 147, 148 are furthermore highlighted in which different subareas 141, 142 of starting layer 140 are situated directly on sacrificial layer sections 132 and are thus connected thereto. Subsection 141 of starting layer 140 is, in this case, connected via U-shaped connecting areas 147 to sacrificial layer sections 132 which are present peripherally or on the edge of sacrificial layer sections 132. The other subsection 142 of starting layer 140 is, however, connected via rectangular connecting areas 148 to sacrificial layer sections 132, rectangular connecting areas 148 being situated within U-shaped connecting areas 147. These shapes of connecting areas 147, 148 are due to the stripe or rectangular shape of sacrificial layer sections 132 and due to the meandering or the U-shaped trench sections of "extended" trench structure 170.

The design of the seismic mass having multiple "coupling points" which are situated next to one another in the form of multiple sacrificial layer sections 132 enables a relatively high stability of the insulating mechanical coupling between functional layer sections 161, 162 situated on starting layer sections 141, 142. The elongated or stripe-like shape (still existing after the sacrificial layer etching) of sacrificial layer sections 132 may also have a positive effect on the stability of the coupling, since connecting areas 147, 148 on sacrificial layer sections 132 may also have an elongated shape in this way. Due to the electrical isolation of subsections 141, 142, 161, 162 of starting and functional layers 140, 160, it is possible to apply different electrical potentials to functional layer sections 161, 162. Such an implementation may be advantageous for different embodiments of micromechanical component 200.

Component 200 may, for example, be an acceleration sensor in which a deflection of the seismic mass caused as a result of acceleration is capacitively detected. Due to the electrically insulating mechanical coupling of functional layer sections 161, 162 situated on starting layer sections 141, 142, a fully differential evaluation concept may be used. For this purpose, functional layer sections 161, 162 (as well as, if necessary, intermediate layer 120 which is electrically connected to functional layer section 161 via starting layer section 141) which perform the same deflection are used as electrodes which are independent of one another. In this way, it is possible to increase the sensor useful signal and, at the same time, to suppress electrical interferences which may be due to EMC or PSSR effects.

In one alternative embodiment to be considered of component 200 as a yaw-rate sensor, in which the seismic mass may be electrostatically put into oscillation via appropriate drive structures and the deflection of the seismic mass may be capacitively detected via appropriate detection structures, the insulating coupling may also prove advantageous. It is in particular possible to electrically isolate the drive and detection elements provided on the seismic mass and to subsequently enable a simplified architecture of an associated evaluation circuit based thereon. For example, functional layer section 161 may be designed to have drive elements, and functional layer section 162 may be designed to have detection elements (or vice versa).

Another advantage of the example method explained with reference to the figures is that the method may be included relatively easily into conventional MEMS process sequences. For this purpose, it may be considered to provide an additional plane or an additional layer, if necessary, in the form of etch stopping layer structures 150 used for protecting starting layer 140 during the trench etching and to carry out an additional etching process for cutting through starting layer 140 and thus causing the electrical isolation of functional layer sections 161, 162.

The process sequence explained with reference to the figures as well as described and shown component 200 represent preferred or exemplary specific embodiments of the present invention. However, other specific embodiments are also possible as a deviation herefrom.

For example, it is possible that instead of separate etch stopping layer structures 150, which are positioned in the area of protective structures 190, a contiguous, and also meandering, etch stopping layer structure is produced. Meandering trench structure 170 may be similarly produced in such a way that the meandering etch stopping layer structure is only partially exposed (i.e., except for an edge area). Within the scope of the sacrificial layer etching, the meandering etch stopping layer structure may be removed (again).

Furthermore, it may be considered to implement a mechanical coupling between the functional layer sections only via a single sacrificial layer section 132. For this purpose, the processes described above with reference to the figures may be carried out in a similar manner. For example, a structured second sacrificial sublayer 130 corresponding to FIG. 8 may be produced which has instead of multiple stripe-like sacrificial layer sections 132 only a single sacrificial layer section 132 extending from basic section 131. In such an implementation, only a single U-shaped etch stopping layer structure 150 may be formed in the area of sacrificial layer section 132 (also enclosed by a protective structure 190 in this case). A trench structure 170 produced with the aid of trench etching may furthermore have only a single trench section overhanging in a U-shaped manner and trench sections adjoining it running linearly or in a straight line. In this case, functional layer sections 161, 162, separated by trench structure 170, are consequently, after the sacrificial layer etching, connected only at one point via starting layer 140 which is exposed in the area of trench structure 170 and may also be cut through.

Another possible modification is to use, instead of shown substrate 100, a substrate, or carrier substrate, which is constructed in a different manner and which may already be provided with other layer structures before the above-described process sequence is carried out. For example, it may be considered that the provided substrate includes two additional conductive polysilicon layers which are situated one on top of the other and which are separated from one another by an additional sacrificial layer or sacrificial sublayer. Here, intermediate layer 120, which is subsequently applied and shown in the figures, may also be referred to as an "intermediate polysilicon layer." When using such a substrate, the sacrificial layer etching may result in that in addition to the above-described seismic mass a(n) (additional) polysilicon layer situated below it is also exposed and may thus be used as an additional self-supporting or movable mass.

Moreover, it is pointed out that instead of the described and shown shapes and geometries, other shapes may also be used for individual structures and layers. Other materials may also be used, if necessary, instead of the indicated materials.

What is claimed is:

1. A method for manufacturing a micromechanical component, comprising:
    providing a substrate and a layer system on top of the substrate, the layer system including an insulating sacrificial layer, an intermediate layer, and a starting layer, the intermediate layer and the starting layer forming a protective structure which partially encloses an upper surface and a lower surface of a sacrificial layer section of the sacrificial layer;
    forming an etch stopping layer structure on the starting layer in an area of the enclosed sacrificial layer section;
    growing a functional layer, which encloses the etch stopping layer structure, on the starting layer;
    carrying out a trench etching process, in which etch access openings to the sacrificial layer and a trench structure, which reaches the etch stopping layer structure and separates the functional layer into subsections, are formed, and an etching of the starting layer is prevented in the area of the etch stopping layer structure by the etch stopping layer structure;
    carrying out a sacrificial layer etching process for providing a movable mass, the protective structure preventing the enclosed sacrificial layer section from being removed completely and the etch stopping layer structure being removed, so that a subarea of the starting layer forming the protective structure is exposed; and
    cutting through the exposed subarea of the starting layer forming the protective structure.

2. The method as recited in claim 1, wherein the providing of the the layer system on top of the substrate includes:
    forming a first sacrificial sublayer on the substrate;
    forming the intermediate layer on the first sacrificial sublayer and structuring the intermediate layer;
    forming a second sacrificial sublayer on the first sacrificial sublayer and on the intermediate layer;
    structuring the second sacrificial sublayer for providing the sacrificial layer section, the sacrificial layer section being situated on the intermediate layer; and
    forming the starting layer on the intermediate layer and on the second sacrificial sublayer, the protective structure enclosing the sacrificial layer section being formed.

3. The method as recited in claim 2, wherein the intermediate layer is structured in such a way that the intermediate layer includes a planar layer section.

4. The method as recited in claim 1, wherein the protective structure which encloses the sacrificial layer section and is formed from the intermediate layer and the starting layer is accessible only via a predefined opening area.

5. The method as recited in claim 1, wherein the sacrificial layer section has a stripe-like shape.

6. A method for manufacturing a micromechanical component, comprising:
    providing a substrate having a layer system including an insulating sacrificial layer, an intermediate layer, and a starting layer, the intermediate layer and the starting layer forming a protective structure which partially encloses a sacrificial layer section of the sacrificial layer;
    forming an etch stopping layer structure on the starting layer in an area of the enclosed sacrificial layer section;
    growing a functional layer, which encloses the etch stopping layer structure, on the starting layer;
    carrying out a trench etching process, in which etch access openings to the sacrificial layer and a trench structure, which reaches the etch stopping layer structure and separates the functional layer into subsections, are formed, and an etching of the starting layer is prevented in the area of the etch stopping layer structure by the etch stopping layer structure;
    carrying out a sacrificial layer etching process for providing a movable mass, the protective structure preventing the enclosed sacrificial layer section from being removed completely and the etch stopping layer structure being removed, so that a subarea of the starting layer is exposed; and
    cutting through the starting layer in the exposed subarea;
    wherein the etch stopping layer structure and the trench structure have a U-shaped design in the area of the etch stopping layer structure.

7. The method as recited in claim 1, wherein the etch access openings are formed in an area outside of the enclosed sacrificial layer section.

8. The method as recited in claim 1, wherein the layer system situated on the substrate has multiple protective structures which are formed from the intermediate layer and the starting layer and which each enclose a sacrificial layer section.

9. The method as recited in claim 1, wherein the trench structure has a meandering shape.

* * * * *